(12) United States Patent
Chen et al.

(10) Patent No.: US 6,900,985 B2
(45) Date of Patent: May 31, 2005

(54) HEAT SINK CLIP WITH PRESSING CAM

(75) Inventors: Chun-Chi Chen, Tu-Chen (TW); Hsieh Kun Lee, Tu-Chen (TW); Zhigang Liu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/190,177

(22) Filed: Jul. 5, 2002

(65) Prior Publication Data

US 2003/0218866 A1 Nov. 27, 2003

(30) Foreign Application Priority Data

May 24, 2002 (TW) .......................................... 91207532

(51) Int. Cl.[7] .............................................. H05K 7/20
(52) U.S. Cl. ...................... 361/704; 24/458; 257/719; 16/223
(58) Field of Search ................................ 248/505, 510; 24/453, 457, 458, 625; 165/80.3, 185; 174/16.3; 257/718, 719, 722, 726, 727; 361/687, 703, 704, 705, 709–712, 717–719; 16/223, 366, 371, DIG. 3; 439/485, 487

(56) References Cited

U.S. PATENT DOCUMENTS

| | | | | |
|---|---|---|---|---|
| 6,082,440 A | * | 7/2000 | Clemens et al. | 165/80.3 |
| 6,430,051 B1 | * | 8/2002 | Yang et al. | 361/704 |
| 6,480,384 B2 | * | 11/2002 | Lo | 361/704 |
| 6,519,155 B1 | * | 2/2003 | Walkup | 361/704 |

* cited by examiner

Primary Examiner—Gerald Tolin
(74) Attorney, Agent, or Firm—Wei Te Chung

(57) ABSTRACT

A heat sink clip (1) includes a main body (50), an operating part (30) movably received in the main body, and a pressing cam (70) pivotably attached to the main body. The main body includes a central portion (52), and two hooks (54) depending from opposite ends of the central portion. The operating part includes a driving portion (34) and a handle (32). A plurality of first teeth (346) is formed in the driving portion. The pressing cam includes a plurality of second teeth (74) that mesh with the first teeth. When the handle is slid, the first teeth drive the second teeth to rotate. The pressing cam accordingly rotates until it is forced against a top surface (3a) of a heat sink (3). The main body is thus resiliently displaced upwardly, causing the hooks to be firmly engaged with a socket (5) on which the CPU is mounted.

20 Claims, 4 Drawing Sheets

HEAT SINK CLIP WITH PRESSING CAM

BACKGROUND OF THE INVENTION

1. Field of the Invention

The present invention relates to clips for heat sinks, and more particularly to a clip for a heat sink which facilitates attachment of the heat sink to a heat-generating device such as a central processing unit (CPU).

2. Description of Related Art

Computer central processing units (CPUs) are the core administrators of electrical signals in contemporary computers. Continued development of CPUs has enabled them to perform more and more functions. Correspondingly, heat generated by CPUs is constantly increasing. This can adversely affect the operational stability of computers. To speedily remove heat from the CPUs, heat sinks having great heat conductivity are attached to the CPUs. The heat sinks are commonly attached to the CPUs by clips.

A conventional clip attaches a heat sink to a CPU using screws and springs. However, fastening or removal of the screws using a tool is unduly laborious and time-consuming. Furthermore, there is a risk of accidental damage to the heat sink and its associated printed circuit board (PCB). Moreover, an excessively large tolerance is often accumulated in the CPU/clip/heat sink assembly, which makes the installation less precise and less reliable.

Thus, a clip which overcomes the above-mentioned problems is strongly desired.

SUMMARY OF THE INVENTION

Accordingly, an object of the present invention is to provide a heat sink clip which readily and securely attaches a heat sink to a heat-generating electronic device, and which readily detaches the heat sink from the heat-generating electronic device.

In order to achieve the above-mentioned object, a heat sink clip in accordance with a preferred embodiment of the present invention is used to secure a heat sink to a heat generating device such as a CPU. The heat sink clip comprises a main body, an operating part movably received in the main body, and a pressing cam pivotably attached to the main body. The main body comprises a horizontal central portion, and two hooks depending from opposite ends of the central portion respectively. The operating part comprises a driving portion, and a handle extending perpendicularly upwardly from a middle of the driving portion. A plurality of contiguous first teeth is formed in a bottom of the driving portion. The pressing cam comprises a plurality of contiguous peripheral second teeth that mesh with the first teeth of the operating part. When the handle of the operating part is slid along the main body, the first teeth drive the second teeth of the pressing cam to rotate. The pressing cam accordingly rotates until it is forced against a top surface of the heat sink. The main body is thus resiliently displaced upwardly, causing the hooks to be firmly engaged with a socket on which the CPU is mounted. Thus, the heat sink is securely attached on the CPU.

Other objects, advantages and novel features of the present invention will become more apparent from the following detailed description when taken in conjunction with the accompanying drawings.

DETAILED DESCRIPTION OF THE INVENTION

Figure 1:
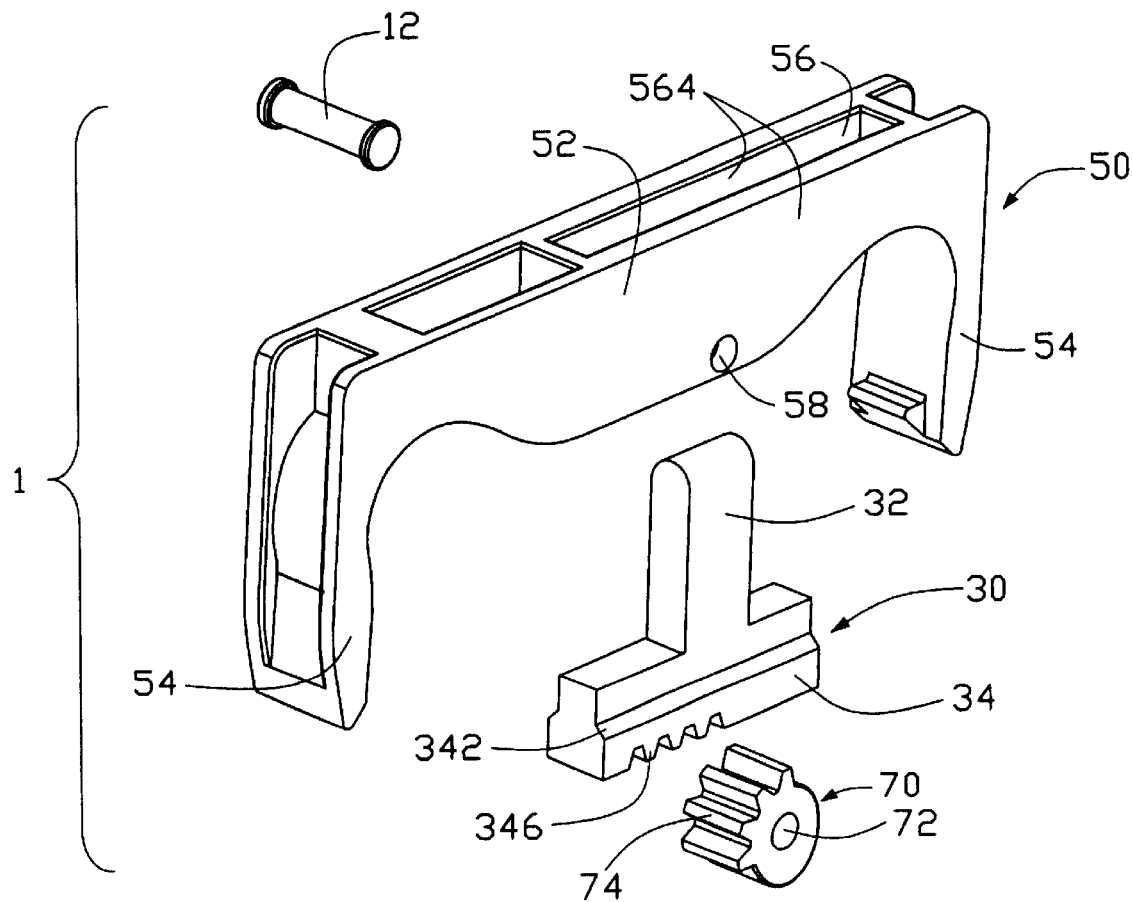
FIG. 1 is an exploded isometric view of a heat sink clip in accordance with a preferred embodiment of the present invention.

Reference will now be made to the drawing figures to describe the present invention in detail.

Figure 2:
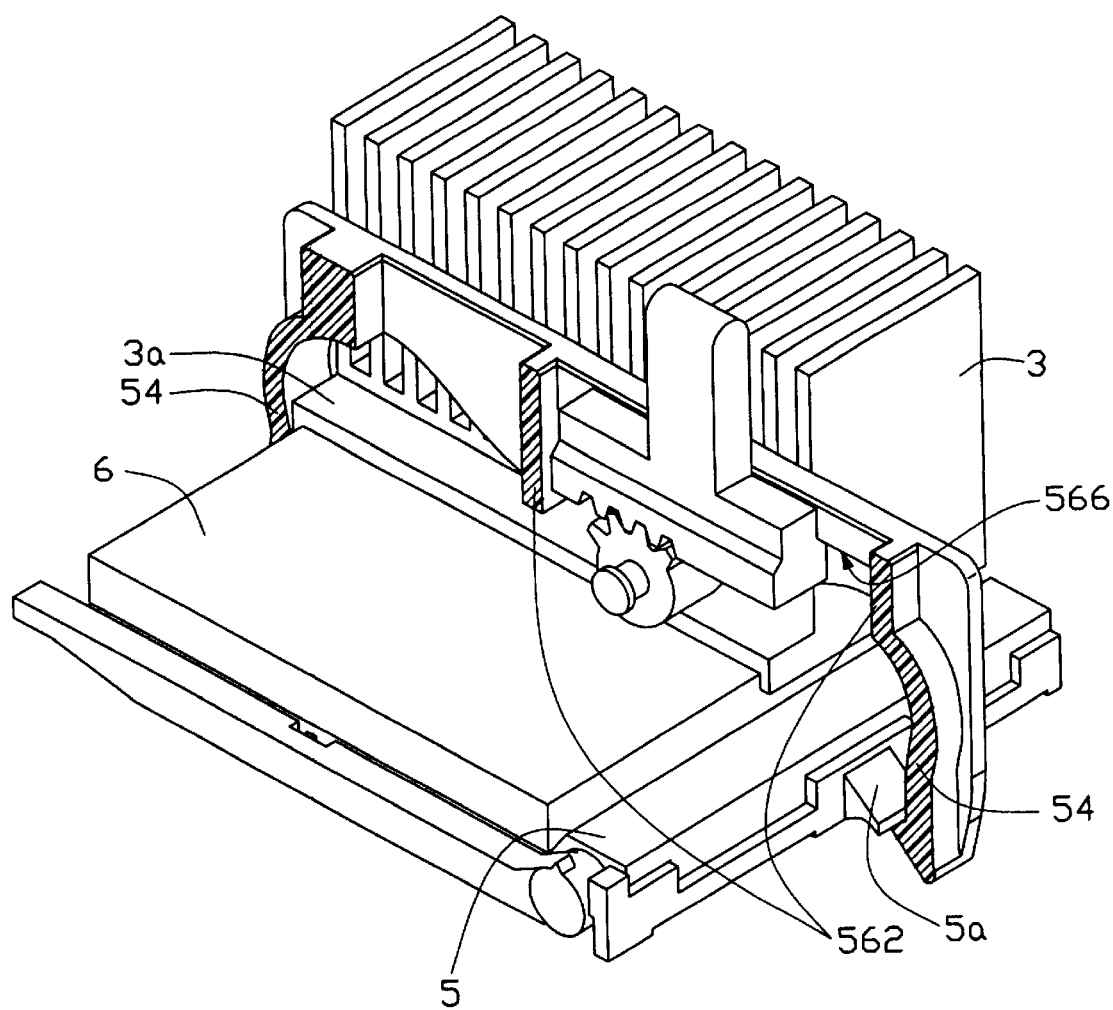
FIG. 2 is a partly cut-away isometric view of the clip of FIG. 1 filly assembled and attaching a heat sink to a CPU mounted on a socket.

Referring to FIGS. 1 and 2, a clip 1 in accordance with a preferred embodiment of the present invention is used to secure a heat sink 3 to a CPU 6. The clip 1 comprises an operating part 30, a main body 50, a pressing cam 70, and a pin 12.

The operating part 30 is generally T-shaped. The operating part 30 comprises a driving portion 34, and a handle 32 extending perpendicularly upwardly from a middle of the driving portion 34. A plurality of first teeth 346 is formed in a bottom of the driving portion 34. A longitudinal slanted surface 342 is formed in a middle portion of each of opposite longitudinal sides of the driving portion 34.

The main body 50 comprises a horizontal central portion 52, and two hooks 54 depending from opposite ends of the central portion 52 respectively. The central portion 52 comprises a pair of side walls 564. A channel 56 is defined between the side walls 564, for receiving the operating part 30. A pair of aligned pivot holes 58 is defined in the side walls 564 respectively, for receiving the pin 12. Two stopping boards 562 are formed between the side walls 564 at opposite ends of the channel respectively, for restricting movement of the operating part 30. A longitudinal slanted wall 566 is formed in an inner portion of each side wall 564, for slidably cooperating with the corresponding slanted surface 342 of the operating part 30. A distance between the two stopping boards 562 allows the driving portion 34 of the operating part 30 to slide therebetween.

The pressing cam 70 comprises a plurality of contiguous peripheral second teeth 74, for meshing with the first teeth 346 of the operating part 30. A through hole 72 is defined through a central axis of the pressing cam 70, corresponding to the pivot holes 58 of the main body 50.

In assembly, the operating part 30 is inserted into the channel 56 of the main body 50. The slanted surfaces 342 of the operating part 30 slidably abut the slanted walls 566 of the main body 50. The pressing cam 70 is inserted into the main body 50, with the through hole 72 of the pressing cam 70 aligning with the pivot holes 58 of the main body 50. The pin 12 is pivotably received in the pivot holes 58 and the through hole 72, thus pivotably connecting the main body 50 and the pressing cam 70. The second teeth 74 of the pressing cam 70 are meshed with the first teeth 346 of the main body 30.

Referring particularly to FIG. 2, in use, the CPU 6 is mounted on a socket 5. The heat sink 3 is placed on the CPU 6. The clip 1 is placed in a cutout (not labeled) transversely defined through parallel fins of the heat sink 3. The pressing cam 70 of the clip 1 rests on a top surface 3a of the heat sink 3. The hooks 54 of the main body 50 are respectively loosely engaged with opposite catches 5a of the socket 5. The handle 32 of the operating part 30 is slid from adjacent one stopping board 562 to an opposite stopping board 562 of the main body 50. The first teeth 346 thus move toward the opposite stopping board 562, and drive the second teeth 74 of the pressing cam 70 to rotate. A pressing point of the pressing cam 70 accordingly rotates until it is forced against the top surface 3a of the heat sink 3. The main body 50 is thus resiliently displaced upwardly, causing the hooks 54 to be firmly engaged with the catches 5a. Thus, the heat sink 3 is securely attached on the CPU 6.

Figure 3:
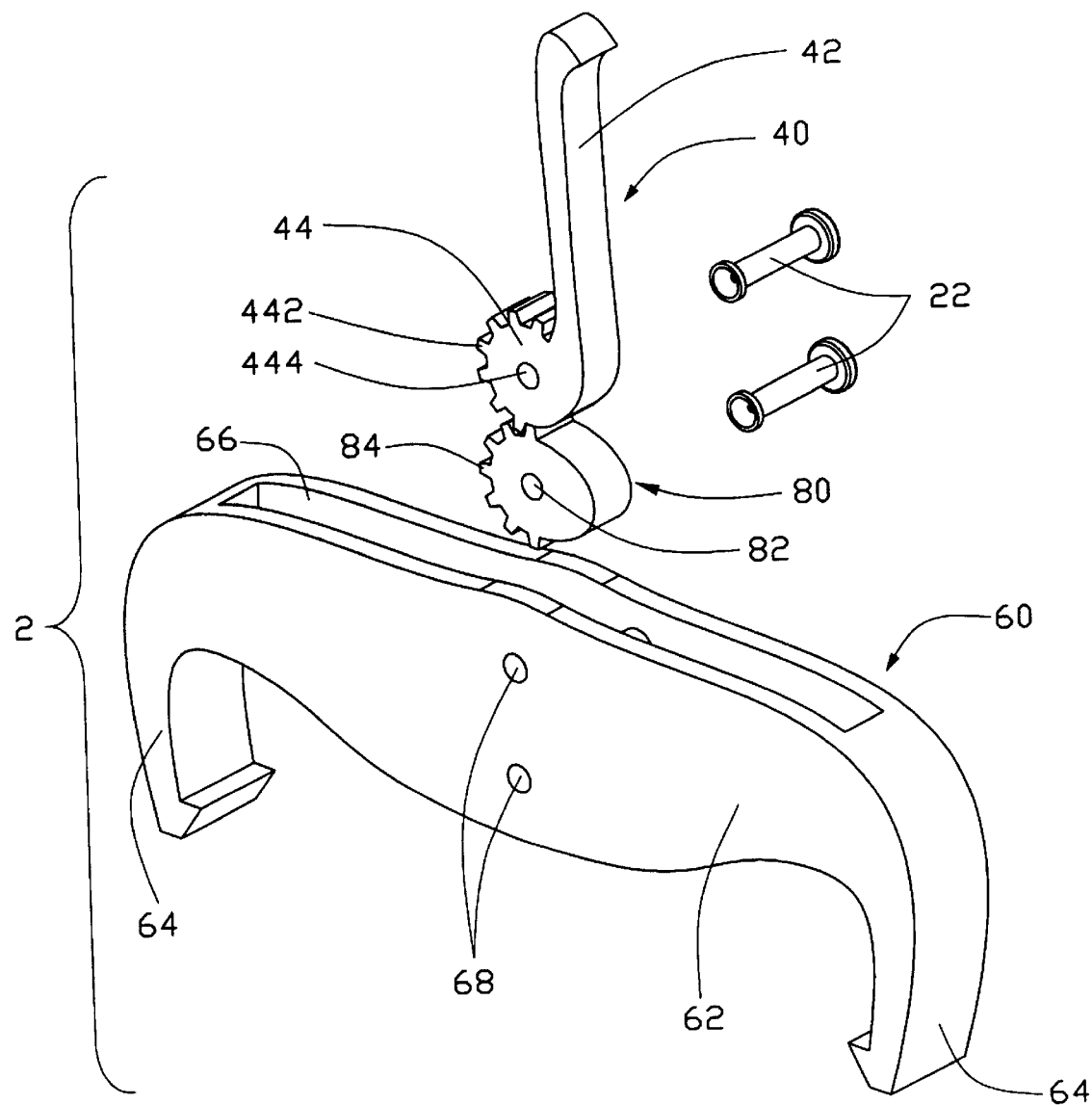
FIG. 3 is an exploded isometric view of a heat sink clip in accordance with an alternative embodiment of the present invention.
Figure 4:
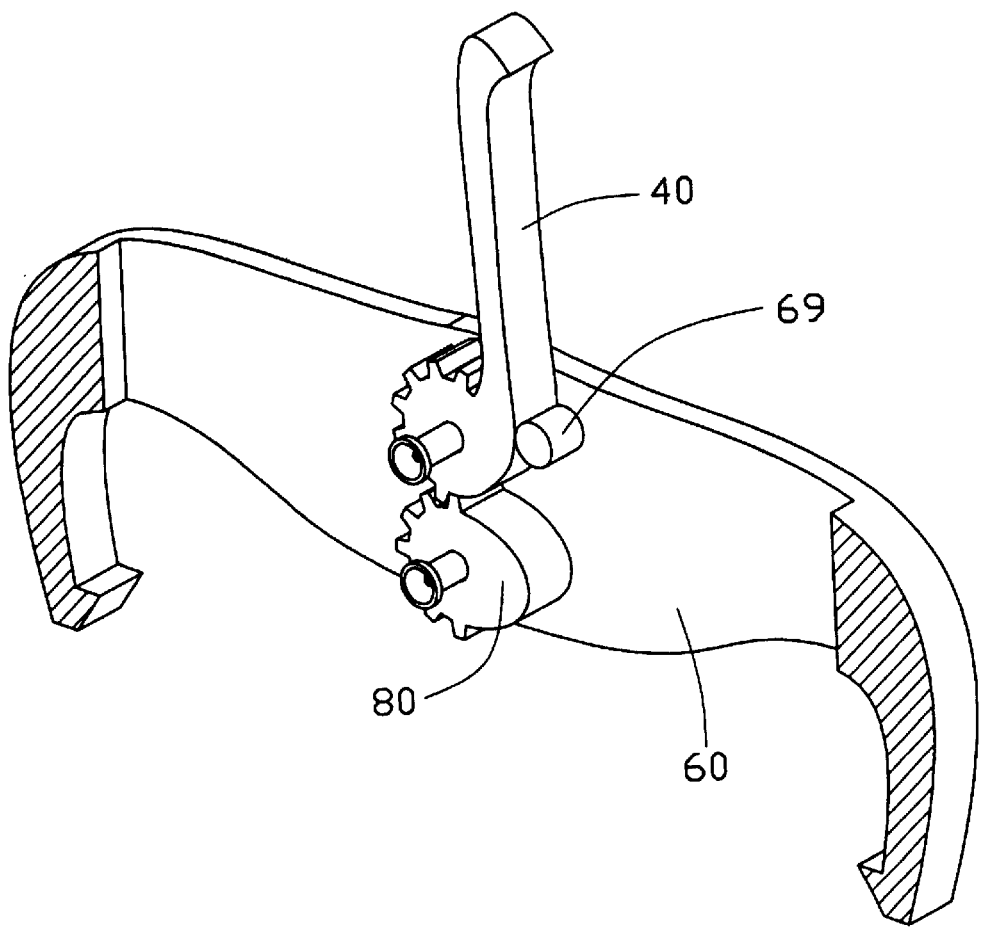
FIG. 4 is an assembled view of the clip of FIG. 3, with part of a main body of the clip cut away.

Referring particularly to FIGS. 3–4, a clip 2 in accordance with an alternative embodiment of the present invention comprises an operating part 40, a main body 60, a pressing cam 80, and two pins 22.

The operating part 40 comprises a driving portion 44, and a handle 42 extending perpendicularly upwardly from the driving portion 44. A plurality of contiguous first teeth 442 is formed around a periphery of the driving portion 44, equidistant from a central axis thereof. A first through hole 444 is defined through the central axis of the driving portion 44.

The main body 60 is similar to the main body 50 of the clip 1. The main body 60 comprises a horizontal central portion 62, and two hooks 64 depending from opposite ends of the central portion 62 respectively. The central portion 62 comprises a pair of side walls (not labeled). A channel 66 is defined between the side walls, for movably receiving the operating part 40 therein. An upper pair of pivot holes 68 is defined in the side walls respectively, and a lower pair of pivot holes 68 is defined in the side walls respectively. A stopping post 69 is formed in a middle portion of the channel 66. The stopping post 69 is used to restrict rotation of the operating part 40. One of the pins 22 is received in the upper pair of pivot holes 68 and the first through hole 444 of the operating part 40, thus pivotably connecting the main body 60 and the operating part 40.

The pressing cam 80 is for pressing the top surface 3a of the heat sink 3 (see FIG. 2). The pressing cam 80 comprises a plurality of contiguous peripheral second teeth 84 equidistant from a central axis thereof, and a second through hole 82 defined through the central axis. The second teeth 84 mesh with the first teeth 442 of the operating part 40. The other of the pins 22 is received in the lower pair of pivot holes 68 of the main body 60 and the second through hole 82, thus pivotably connecting the main body 60 and the pressing cam 80.

In use, the handle 42 is rotated from a vertical position down toward the main body 50, and the first teeth 442 drive the second teeth 84 to rotate. A pressing point of the pressing cam 80 accordingly rotates until it is forced against the top surface 3a of the heat sink 3. The main body 60 is thus resiliently displaced upwardly, causing the hooks 64 of the main body 60 to be firmly engaged with the catches 5a of the socket 5. Thus, the heat sink 3 is securely attached on the CPU 6.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip for attaching a heat sink to heat-generating device, the clip comprising:
    a main body having a central portion and two hooks depending away from opposite ends of the central portion, the central portion defining a channel; an operating part movably received in the channel of the main body, the operating part comprising a driving portion and a handle connecting with the driving portion, the driving portion having a plurality of first teeth; and
    a pressing cam pivotably attached to the main body and adapted to abut the heat sink, the pressing cam having a plurality of second teeth meshing with the first teeth of the operating part.

2. The clip as described in claim 1, wherein the operating part is slidably received in the channel of the main body.

3. The clip as described in claim 2, wherein the central portion has two opposite side walls, and the channel is defined between the side walls.

4. The clip as described in claim 3, wherein each of the side walls comprises a slanted wall and defines a first hole.

5. The clip as described in claim 2, wherein two spaced stops are arranged at opposite ends of the channel, for restricting movement of the operating part.

6. The clip as described in claim 2, wherein the first teeth are formed at a bottom of the driving portion.

7. The clip as described in claim 4, wherein a slanted surface is formed at each of opposite sides of the driving portion, the slanted surfaces slidably abutting the slanted walls of the main body.

8. The clip as described in claim 4, wherein a second hole is defined in the pressing cam corresponding to the first holes of the main body, and a pin extends through the first and second holes thereby pivotably connecting the pressing cam and the main body.

9. The clip as described in claim 1, wherein the operating part is pivotably received in the channel of the main body.

10. The clip as described in claim 9, wherein the central portion has two opposite side walls, and the channel is defined between the side walls.

11. The clip as described in claim 10, wherein each of the side walls defines two holes.

12. The clip as described in claim 10, wherein a stopping member is arranged in the channel, for restricting rotation of the operating part.

13. The clip as described in claim 11, wherein the driving portion defines a hole corresponding to two aligned holes of the side walls of the main body, and a pin extends through the hole of the driving portion and said two aligned holes of the side walls of the main body thereby pivotably connecting the operating part and the main body.

14. The clip as described in claim 11, wherein the pressing cam defines a hole corresponding to another two aligned holes of the side walls of the main body, and another pin extends through the hole of the pressing cam and said other aligned holes of the side walls of the main body thereby pivotably connecting the pressing cam and the main body.

15. An electronic device assembly comprising:
    a socket;
    an electronic device mounted on the socket;
    a heat sink attached on the electronic device; and
    a clip securing the heat sink to the electronic device, the clip comprising a main body engaged with the socket, an operating part movably received in the main body, and a pressing cam pivotably connected with the main body, the operating part having a driving portion and a handle connecting with the driving portion, the driving portion having a plurality of first teeth, the pressing cam having a plurality of second teeth meshing with the first teeth; wherein the operating part is actuatable to rotate the pressing cam to press the heat sink.

16. The clip as described in claim 15, wherein the main body has a central portion.

17. The clip as described in claim 16, wherein two hooks depend away from opposite ends of the central portion and engage with the socket.

18. The clip as described in claim 17, wherein the central portion defines a channel movably receiving the operating part therein.

19. An electronic device assembly comprising:
   a socket module with a heat generating device thereon;
   at least one catch disposed on a periphery of said socket module;
   a heat sink seated upon the heat generating device;
   a clip positioning on the heat sink, said clip including:
      a central portion with at least one hook extending downwardly from one end thereof;
      an operation part and a pressing cam discrete from each other and respectively moveably attached on the central portion, said pressing cam being moved associatively with said operation part, and at least one of said operation part and said pressing cam being pivotal with regard to the central portion; wherein
   said operation part and said pressing cam are in a first position where the central portion is in a lower position and the hook and the catch are engaged with each other in a loose manner, while said operation part and said pressing cam are in a second position where the central portion is in an upper position and the hook and the catch are engaged with each other in a tight manner;
   wherein said operation part and the pressing cam are configured with gear teeth interengaged with each other for associative movement therebetween.

20. The assembly as described in claim 19, wherein said pressing cam is configured with different vertical dimensions to result in different spaces between the central portion and an abutment surface of the heat sink when said pressing cam is in said first and second positions.

* * * * *